US009414536B2

(12) United States Patent  
Yamasaki

(10) Patent No.: US 9,414,536 B2  
(45) Date of Patent: Aug. 9, 2016

(54) TAPE FEEDER AND TAPE FEEDING METHOD FOR CHIP MOUNTER

(71) Applicant: HANWHA TECHWIN CO., LTD., Changwon-Si (KR)

(72) Inventor: Kimiyuki Yamasaki, Changwon (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 0 days.

(21) Appl. No.: 14/427,682

(22) PCT Filed: Apr. 3, 2013

(86) PCT No.: PCT/KR2013/002742  
§ 371 (c)(1),  
(2) Date: Mar. 12, 2015

(87) PCT Pub. No.: WO2014/042327  
PCT Pub. Date: Mar. 20, 2014

(65) Prior Publication Data  
US 2015/0351294 A1  Dec. 3, 2015

(30) Foreign Application Priority Data  
Sep. 12, 2012 (KR) .................. 10-2012-0101145

(51) Int. Cl.  
*H05K 13/02* (2006.01)  
*B65H 35/00* (2006.01)  
(Continued)

(52) U.S. Cl.  
CPC .............. *H05K 13/02* (2013.01); *B65D 85/671* (2013.01); *B65H 35/0006* (2013.01);  
(Continued)

(58) Field of Classification Search  
CPC ............ H05K 13/0417; H05K 13/021; H05K 13/0408  
See application file for complete search history.

(56) References Cited

U.S. PATENT DOCUMENTS 4,820,369 A * 4/1989 Kubo ................. H05K 13/0417  
156/259  
7,713,376 B2 * 5/2010 Larsson ............... H05K 13/021  
156/65  
(Continued)

FOREIGN PATENT DOCUMENTS

JP 6-91343 B2 11/1994  
JP 11-261293 A 9/1999  
(Continued)

OTHER PUBLICATIONS

Int. Search Report dated Jul. 15, 2013 in International Application No. PCT/KR2013/002742 (PCT/ISA/210).  
(Continued)

*Primary Examiner* — Mark A Osele  
(74) *Attorney, Agent, or Firm* — Sughrue Mion, PLLC

(57) ABSTRACT

A tape feeder for a chip mounter, the tape feeder including: a tape support unit extending along a moving direction of a carrier tape to which a cover tape is separably attached, and contacting a top surface of the carrier tape; a separation unit separating a first side portion of the cover tape in a lengthwise direction; a bending guide unit guiding the first side portion of the cover tape separated from the carrier tape such that the first side portion of the cover tape separated from the carrier tape is bent and away from the separated portion of the carrier tape; and a folding guide unit folding the first side portion over a second side portion of the cover tape to drop the first side portion downward.

13 Claims, 8 Drawing Sheets

(51) Int. Cl.
 B65H 37/00 (2006.01)
 B65D 85/671 (2006.01)
 H05K 13/04 (2006.01)
 B65D 73/02 (2006.01)
(52) U.S. Cl.
 CPC ........... *B65H 37/002* (2013.01); *H05K 13/021* (2013.01); *H05K 13/0408* (2013.01); *H05K 13/0417* (2013.01); *B65D 73/02* (2013.01); *Y10T 156/1168* (2015.01); *Y10T 156/1967* (2015.01)

(56) References Cited

U.S. PATENT DOCUMENTS 7,866,518 B2 * 1/2011 Wada .................... B65H 20/20
 226/128
7,930,819 B2 4/2011 Yonemitsu et al.
2003/0219330 A1 * 11/2003 Lyndaker ........... H05K 13/0417
 414/411
2011/0243695 A1 10/2011 Hwang et al.

FOREIGN PATENT DOCUMENTS

| JP | 2007-280979 | A | | 10/2007 |
|----|-------------|---|---|---------|
| JP | 2008-91672 | A | | 4/2008 |
| JP | 2011-211169 | A | | 10/2011 |
| JP | 2012009579 | A | * | 1/2012 |

OTHER PUBLICATIONS

Written Opinion dated Jul. 15, 2013 in International Application No. PCT/KR2013/002742 (PCT/ISA/237).

* cited by examiner

TAPE FEEDER AND TAPE FEEDING METHOD FOR CHIP MOUNTER

TECHNICAL FIELD

Embodiments of the present invention relates to a tape feeder and a tape feeding method for a chip mounter, and more particularly, to a tape feeder and a tape feeding method for a chip mounter, which are capable of discharging a cover tape and a carrier tape together without completely separating the cover tape and the carrier tape.

BACKGROUND ART

Chip mounters are apparatuses for surface-mounting an electronic component onto a printed circuit board (PCB), and perform operations of receiving and moving various electronic components, such as integrated circuits (ICs), diodes, capacitors, and resistors, from a component provider to surface-mounting locations of a PCB, and then surface-mounting the various electronic components on the PCB.

The chip mounters generally include a tape feeder for providing a carrier tape including a component, a conveyer for transferring a PCB, a head assembly including nozzles to pick up the component from the tape feeder and surface-mount the component onto the PCB, and a driving apparatus for moving the head assembly in a horizontal or vertical direction.

Generally, the tape feeder continuously provides a carrier tape including an electronic component while separating a cover tape attached to a surface of the carrier tape, thereby exposing the electronic component for the head assembly to pick it up. The carrier tape from which the cover tape is separated is discharged in front of the tape feeder, and the cover tape separated from the carrier tape is discharged at the rear of the tape feeder.

If the cover tape separated from the carrier tape is not quickly collected, the cover tape formed of very thin vinyl material may get tangled, and generate static electricity or interfere with other components of the tape feeder, and thus overall operations of the tape feeder and the chip mounter may have to be stopped.

US 2003/0230617 (published on 18 Dec. 2003) discloses a tape feeder including a mechanism for separating a cover tape separated from a carrier tape. In such a tape feeder, the carrier tape and the cover tape are separately collected by completely separating the cover tape from the carrier tape. Accordingly, separate components need to be installed in the tape feeder in order to continuously wind the separated cover tape or to transfer the separated cover tape to a separate collection unit and discharge the separated cover tape, and thus the number of components of the tape feeder is increased and a volume of the tape feeder is also increased.

DISCLOSURE OF INVENTION

Technical Problem

Embodiments of the present invention provide a tape feeder and a tape feeding method for a chip mounter, which are capable of discharging a cover tape and a carrier tape together, without completely separating the cover tape and the carrier tape.

Embodiments of the present invention also provide a tape feeder and a tape feeding method for a chip mounter, which are capable of effectively handling carrier tapes having various widths and electronic components having various sizes.

Embodiments of the present invention also provide a tape feeder and a tape feeding method for a chip mounter, wherein an operation of separating a cover tape from a carrier tape is stably and accurately performed.

Solution to Problem

According to an embodiment of the present invention, there is provided a tape feeder for a chip mounter, the tape feeder including: a tape support unit extending along a moving direction of a carrier tape having one surface to which a cover tape is separably attached, and contacting a top surface of the carrier tape; a separation unit for separating a first side portion of the cover tape in a lengthwise direction from the carrier tape; a bending guide unit for guiding the first side portion of the cover tape separated from the carrier tape such that the first side portion of the cover tape separated from the carrier tape is bent and away from a separated portion of the carrier tape; and a folding guide unit for folding the first side portion of the cover tape over a second side portion of the cover tape, which is not separated from the carrier tape, to drop the first side portion downward.

The cover tape may be bent by an angle within a range from 225도 to 315도 with respect to the carrier tape.

The tape feeder may further include a pair of sprockets disposed below the tape support unit and respectively disposed in front of and at the rear of the separation unit in a transfer direction of the carrier tape so as to bind and move the carrier tape, wherein the tape support unit and the pair of sprockets may be disposed such that the top surface of the carrier tape moves while contacting a bottom surface of the tape support unit.

The separation unit may be disposed to cross a straight line extending in the moving direction of the carrier tape at a contact point of the pair of sprockets and the carrier tape.

The separation unit may be disposed to tilt with respect to the moving direction of the carrier tape.

A thickness of the separation unit may increase along the moving direction of the carrier tape.

The bending guide unit may include at least one plate disposed at a top of the separation unit, and the at least one plate may have a sloping side tilting with respect to the moving direction of the carrier tape.

A tilt angle of the separation unit with respect to the moving direction of the carrier tape may be larger than a tilt angle of the sloping side of the at least one plate with respect to the moving direction of the carrier tape.

The bending guide unit may include a plurality of plates disposed at a top of the separation unit, and the plurality of plates may have sloping sides tilting with respect to the moving direction of the carrier tape at different angles.

The folding guide unit may include a top plate disposed on the separation unit and a side plate bending from the top plate and extending downward to cover a side of the carrier tape.

The bending guide unit may include a first rod member extending from a top of the separation unit towards an edge of the tape support unit and a second rod member extending along an extending direction of the tape support unit to cross the first rod member.

The folding guide unit may include an introducing unit formed at a region corresponding to the first rod member at the edge of the tape support unit to fold the first side portion of the cover tape bent by the first rod member to the edge of the carrier tape, and a side plate extending downward at the edge of the tape support unit to cover the first side portion of the cover tape folded at the edge of the carrier tape.

The first rod member may include a first extending unit extending while tilting with respect to the moving direction of the carrier tape, and a second extending unit bent towards a bottom of the tape support unit to extend towards the side plate at an end of the first extending unit.

A tilt angle of the separation unit with respect to the moving direction of the carrier tape may be larger than a tilt angle of the first extending unit with respect to the moving direction of the carrier tape.

The second extending unit may be connected to the inside of the side plate.

The bending guide unit may bend to have a cross section having a semicircle shape opened downward and extend from the separation unit towards an edge of the tape support unit.

The folding guide unit may include an introducing unit folding the first side portion of the cover tape bent by the bending guide unit to a side of the carrier tape at the edge of the tape support unit, and a side plate extending downward from the edge of the tape support unit to cover the first side portion of the cover tape folded to the side of the carrier tape.

According to another embodiment of the present invention, there is provided a tape feeder for a chip mounter, the tape feeder including: a tape support unit extending along a moving direction of a carrier tape to which a cover tape is separably attached, and contacting a top surface of the carrier tape; a separation unit for separating a first side portion of the cover tape in a lengthwise direction from the carrier tape; a bending guide unit for guiding the first side portion of the cover tape separated from the carrier tape such that the first side portion of the cover tape separated from the carrier tape is bent and away from a separated portion of the carrier tape; a folding guide unit for folding the first side portion of the cover tape at a second side portion of the cover tape, which is not separated; and a pair of sprockets respectively disposed in front of and at the rear of the separation unit, wherein the separation unit is disposed to cross a straight line passing a contact point of the pair of sprockets and the carrier tape and extending in the moving direction of the carrier tape.

The first side portion of the cover tape may rotate at least 180도 and be folded to drop downward over the second side portion of the cover tape, which is not separated from the carrier tape.

According to another embodiment of the present invention, there is provided a method of providing components for a chip mounter, the method including: providing a carrier tape to which a cover tape is separably attached and which accommodates electronic components thereon to a pick-up location of the chip mounter while contacting a top surface of the carrier tape to a bottom surface of a tape support unit; separating a first side portion of the cover tape in a lengthwise direction from the carrier tape; bending the first side portion of the cover tape such that the first side portion crosses over a second side portion of the cover tape and drops downward outside the second side portion of the cover tape; and discharging the carrier tape from which at least the first side portion is separated.

The bending may include: first bending the first side portion of the cover tape to be away from the carrier tape; second bending the first side portion of the cover tape, that is away from the carrier tape, to turnover with respect to the carrier tape; and third bending the second bent first side portion of the cover tape to cross over the second side portion of the cover tape and drop downward with respect to the second side portion of the cover tape.

The first bending, the second bending, and the third bending may be performed by individual units that are not integrally formed with each other.

The separating of the first side portion may be performed by a separation unit disposed to cross a straight line passing a contact point of at least one sprocket for providing the carrier tape and the carrier tape and extending in a moving direction of the carrier tape.

The providing may be performed by a first sprocket disposed at the rear (upstream) of the separation unit in a transfer direction of the carrier tape and a second sprocket disposed in front (downstream) of the separation unit.

According to another embodiment of the present invention, there is provided a method of providing components for a chip mounter, the method including: providing, by at least one sprocket, a carrier tape to which a cover tape is separably attached and accommodating electronic components thereon to a pick-up location of the chip mounter; separating a first side portion of the cover tape in a lengthwise direction from the carrier tape; exposing the electronic components by folding the first side portion separated from the cover tape; and discharging the carrier tape from which at least a part of the cover tape is separated, wherein the separating is performed by a separation unit disposed to cross a straight line passing a contact point of the at least one sprocket and the carrier tape and extending in a moving direction of the carrier tape.

The exposing may include bending the separated first side portion of the cover tape such that the first side portion crosses over a second side portion of the cover tape and drops downward outside a second side portion of the cover tape.

Advantageous Effects of Invention

According to a tape feeder and a tape feeding method for a chip mounter according to the embodiments described above, since a part of a cover tape is bent and folded at an edge of a carrier tape while another part of the cover tape is continuously attached to the carrier tape, the carrier tape and the cover tape may be discharged together outside the tape feeder after an electronic component is picked up.

Widths of the carrier tape and the cover tape may increase or decrease according to a size of an electronic component provided in the carrier tape. However, in the tape feeder according to the above embodiments, since the cover tape is discharged outside the tape feeder together with the carrier tape while the cover tape is folded to a side of the carrier tape, collection apparatuses of the carrier tape and the cover tape may not be differently designed according to changes of the widths of the carrier tape and the cover tape, and a width increase of the tape feeder may be minimized even when the widths of the carrier tape and the cover tape are large.

Also, since a separation unit is disposed at one edge of a tape support unit so as to correspond to a contact point of the carrier tape and a first sprocket, an operation of separating the cover tape from the carrier tape may be stably performed.

BEST MODE FOR CARRYING OUT THE INVENTION

Hereinafter, structures and operations of a tape feeder and a tape feeding method for a chip mounter according to embodiments of the present invention will be described in detail with reference to accompanying drawings in which the embodiments are shown.

Figure 1:
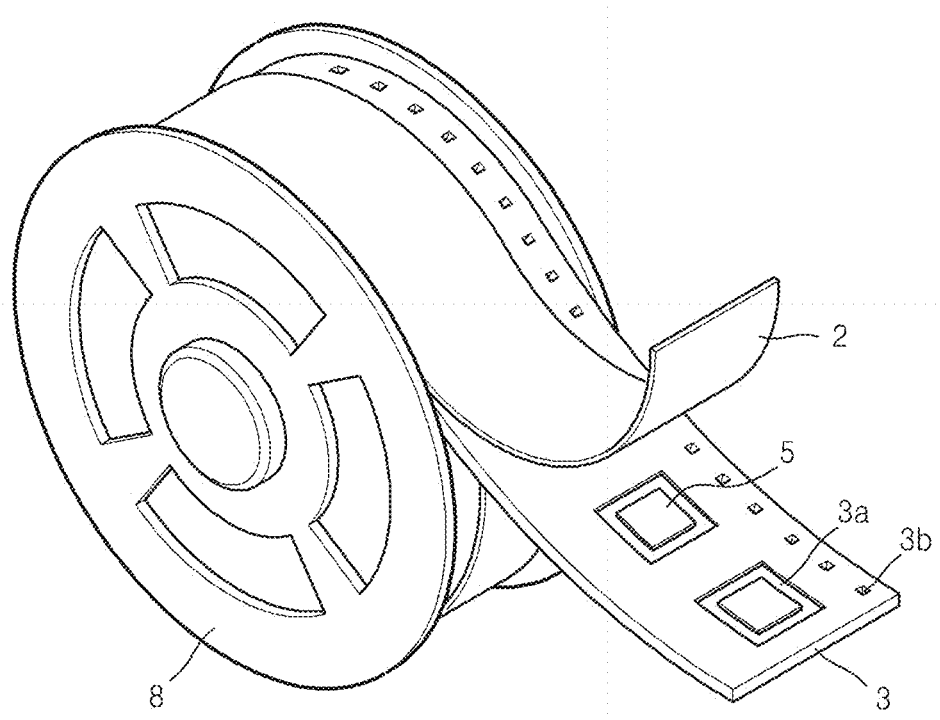
FIG. 1 is a perspective view of a component reel used in a tape feeder for a chip mounter.

FIG. 1 is a perspective view of a component reel 8 used in a tape feeder for a chip mounter.

The tape feeder installed in the chip mounter continuously provides a carrier tape 3 provided from the component reel 8 shown in FIG. 1.

About 2000 to about 5000 electronic components may be accommodated in the component reel 8. A plurality of storage spaces 3a are formed in the carrier tape 3 wound around the component reel 8. An electronic component 5, such as a semi-conductor chip, is accommodated in each of the storage spaces 3a spaced apart from each other along an extending direction of the carrier tape 3. A cover tape 2 is attached to a top of the carrier tape 3, and seals the storage spaces 3a accommodating the electronic components 5. A plurality of transfer holes 3b are formed at regular intervals at an edge of the carrier tape 3.

Figure 2:
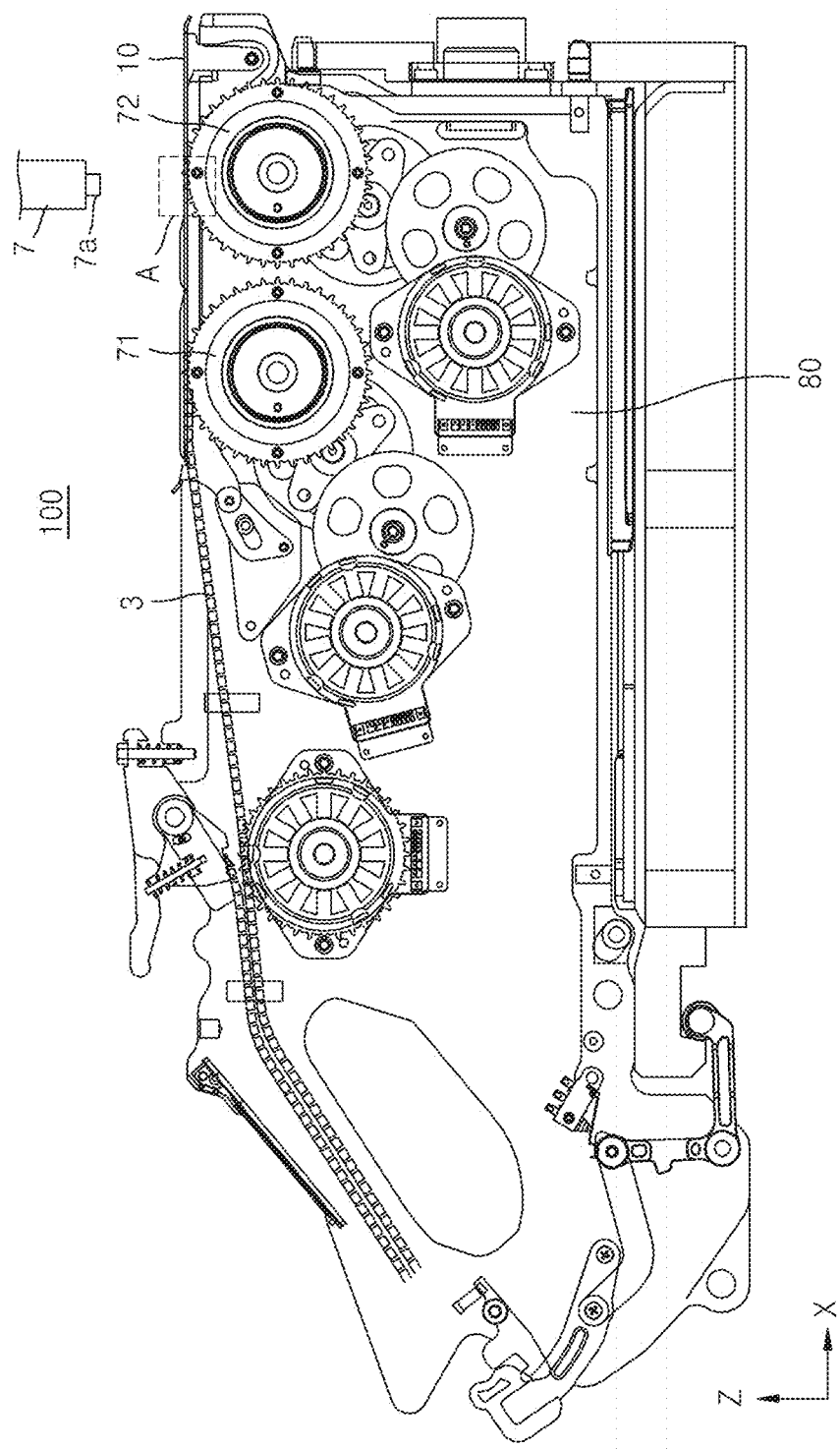
FIG. 2 is a lateral view of a tape feeder for a chip mounter, according to an embodiment of the present invention.

FIG. 2 is a lateral view of a tape feeder 100 for a chip mounter, according to an embodiment of the present invention.

A plurality of the tape feeders 100 shown in FIG. 2 may be disposed in the chip mounter at regular intervals in parallel.

The tape feeder 100 continuously moves the carrier tape 3 to a pick-up location A. In other words, the tape feeder 100 unwinds the carrier tape 3 from a component reel (not shown) while separating a cover tape attached to the carrier tape 3, folding the separated portion of the cover tape to a side of the carrier tape 3, and discharging the separated portion with the carrier tape 3 to outside the tape feeder 100.

A pick-up nozzle 7a of a head assembly 7 of the chip mounter picks up an electronic component (not shown) attached to a region of the carrier tape 3 from which the cover tape is removed, and transfers the picked up electronic component to a predetermined location of a printed circuit board (not shown) of the chip mounter.

A first sprocket 71 and a second sprocket 72 are rotatably provided at a base frame 80. A tape support unit 10 for guiding movement of the carrier tape 3 is provided at a top of the base frame 80. The tape support unit 10 contacts the first and second sprockets 71 and 72. As the first and second sprockets 71 and 72 rotate, the carrier tape 3 moves in an X-axis direction between the tape support unit 10 and the first and second sprockets 71 and 72.

Figure 3:
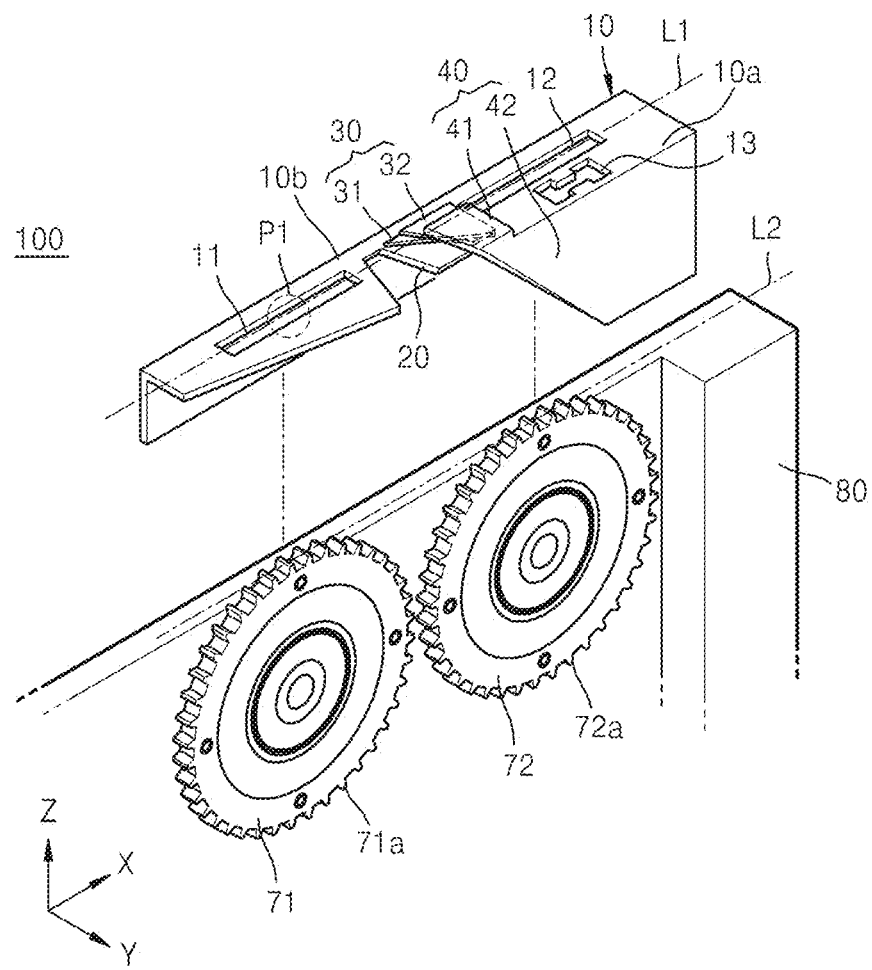
FIG. 3 is a perspective view schematically illustrating a combination relationship of some components of the tape feeder of FIG. 2.
Figure 4:
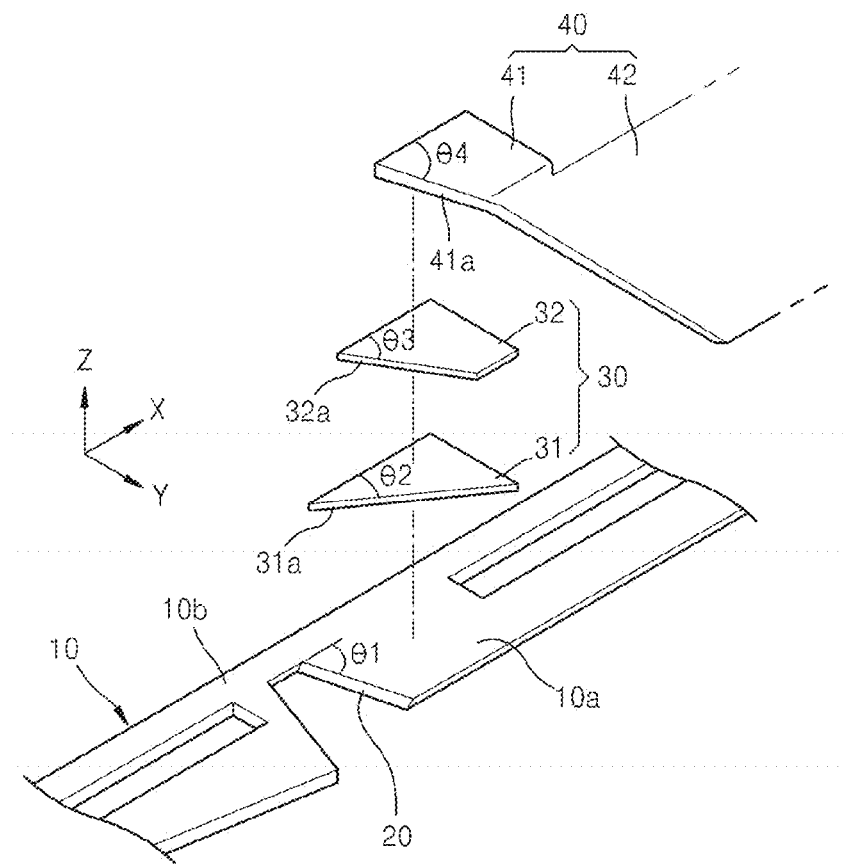
FIG. 4 is an exploded perspective view of some components of the tape feeder of FIG. 3.
Figure 5:
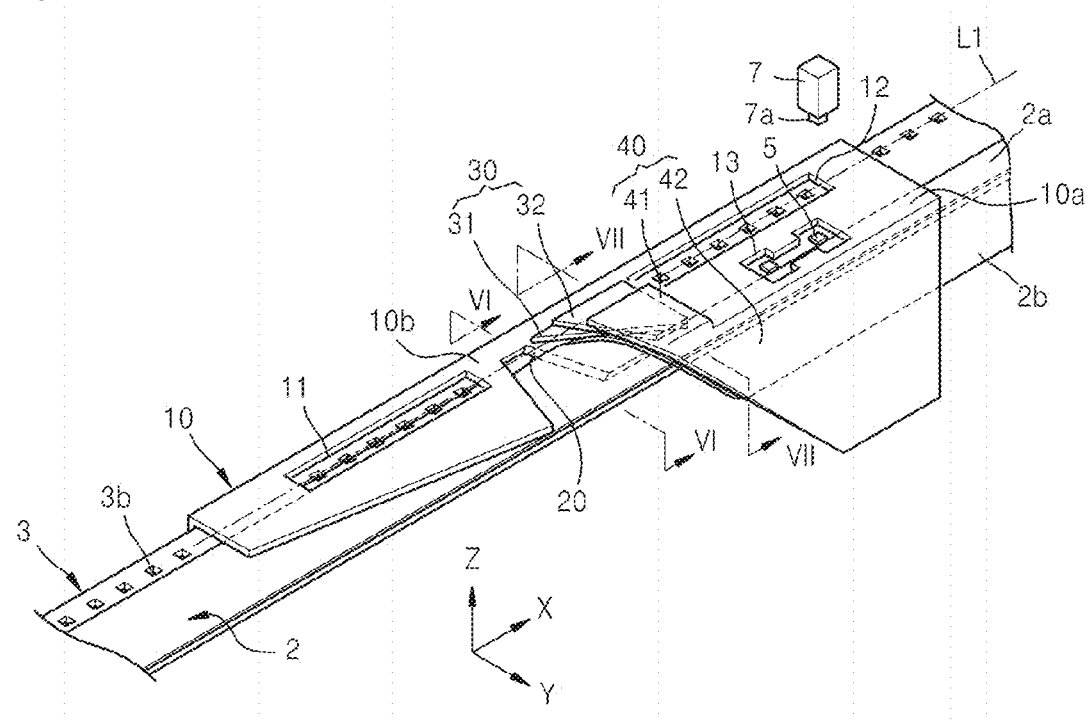
FIG. 5 is a perspective view schematically illustrating an operation state of the tape feeder of FIG. 3.

FIG. 3 is a perspective view schematically illustrating a combination relationship of some components of the tape feeder 100 of FIG. 2, FIG. 4 is an exploded perspective view of some components of the tape feeder 100 of FIG. 3, and FIG. 5 is a perspective view schematically illustrating an operation state of the tape feeder 100 of FIG. 3.

The tape feeder 100 for the chip mounter shown in FIGS. 3 through 5 includes the tape support unit 10 extending along the moving direction of the carrier tape 3 and guiding the movement of the carrier tape 3, a separation unit 20 formed in the tape support unit 10 to separate a part of the cover tape 2, a bending guide unit 30 guiding deformation and movement of the part of the cover tape 2 separated from the carrier tape 3, and a folding guide unit 40 guiding folding of the deformed part of the cover tape 2 to a side of the carrier tape 3.

The tape support unit 10 extends in the moving direction of the carrier tape 3, i.e., in the X-axis direction of FIG. 3, and is formed of a material such as synthetic resin or a metal plate. The tape support unit 10 guides the carrier tape 3 to move along the X-axis direction.

The tape support unit 10 includes the separation unit 20 for separating the part of the cover tape 2 at an edge of the carrier tape 3. In the current embodiment, the separation unit 20 is formed by cutting a part of the tape support unit 10. However, a method of forming the separation unit 20 is not limited thereto, and the separation unit 20 may be separately manufactured from the tape support unit 10, and combined with the tape support unit via welding or by using a coupling unit, such as a rivet, a bolt, and adhesive.

The bending guide unit 30 guides bending of the part of the cover tape 2 separated from the carrier tape 3 so that the part of the cover tape 2 is away from the carrier tape 3. The bending guide unit 30 may include a first plate 31 and a second plate 32 disposed on top of the separation unit 20. In the current embodiment, the bending guide unit 30 includes two plates, i.e., the first and second plates 31 and 32, but the number of plates is not limited thereto and may be one or may be increased to more than two.

The first plate 31 and the second plate 31 and 32 respectively include a first sloping side 31a and a second sloping side 32a, which form different tilt angles −2 and −3 with respect the moving direction of the carrier tape 3. The tilt angle −3 of the second sloping side 32a of the second plate 32 may be larger than the tilt angle −2 of the first sloping side 31a of the first plate 31 (−3>−2).

The folding guide unit 40 includes a top plate 41 covering a top surface of the second plate 32 and a side plate 42 extending downward from the top plate 41 to cover a side of another edge 10a of the tape support unit 10.

The top plate 41 includes a third sloping side 41a tilting with respect to the moving direction of the carrier tape 3. A tilt angle −4 of the third sloping side 41a may be larger than the tilt angle −3 of the second sloping side 32a of the second plate 32 (−4>−3).

The tape support unit 10 may be combined with a top of the base frame 80. The base frame 80 includes the first sprocket 71 and the second sprocket 72. The first and second sprockets 71 and 72 move the carrier tape 3 while contacting the carrier tape 3 by being disposed below the tape support unit 10.

The tape support unit 10 includes long holes 11 and 12 at locations corresponding to protruding portions 71a and 72a of the first and second sprockets 71 and 72. The long holes 11 and 12 also extend along the moving direction of the carrier tape 3. The first and second sprockets 71 and 72 are disposed on a straight line L2 extending along the moving direction of the carrier tape 3 at a location corresponding to the transfer hole 3b of the carrier tape 3.

The tape support unit 10 includes a pick-up hole 13 for externally exposing the region of the carrier tape 3 from which the cover tape 2 is removed.

The separation unit 20 is disposed at one edge 10b of the tape support unit 10 to form a tilt angle −1 with respect to the moving direction of the carrier tape 3. The separation unit 20 is disposed to cross a straight line L1 extending along the moving direction of the carrier tape 3 from a contact point P1 of the first sprocket 71 and the carrier tape 3.

In order to guide easy bending of the part of the cover tape 2 from which the first plate 31 is separated, the tilt angle −2 of the first sloping side 31a of the first plate 31 may be smaller than the tilt angle −1 of the separation unit 20 (−1>−2).

At least some of the tape support unit 10 and carrier tape 3 may vibrate with respect to the base frame 80 while the carrier tape 3 is provided in the X-axis direction while the tape support unit 10 is combined with the base frame 80, the part of the cover tape 2 is separated from the carrier tape 3, and the electronic component 5 is picked up by the pick-up nozzle 7a of the head assembly 7 from the carrier tape 3.

Since the carrier tape 3 needs to stably move even while the electronic component 5 is picked up as the tape support unit 10 moves the carrier tape 3, a mutual location change between the tape support unit 10 and the first sprocket 71 is designed to be reduced at the contact point P1 of the tape support unit 10, the carrier tape 3, and the first sprocket 71. In other words, a location change of the tape support unit 10 and the first sprocket 71 with respect to the base frame 80 at the contact point P1 is reduced.

As described above, since the separation unit 20 is disposed at the one edge 10b of the tape support unit 10 so as to cross the straight line L1 passing the contact point P1 and extending along the moving direction of the carrier tape 3, the separation unit 20 may stably separate the part of the cover tape 2 from the carrier tape 3 while the carrier tape 3 is moving. Also, since the carrier tape 3 is stably moved to the separation unit 20 while the first and second sprockets 71 and 72 contact the carrier tape 3 respectively in front of and at the rear of the separation unit 20, vibration generated when the cover tape 2 is separated may be reduced.

Figure 6:
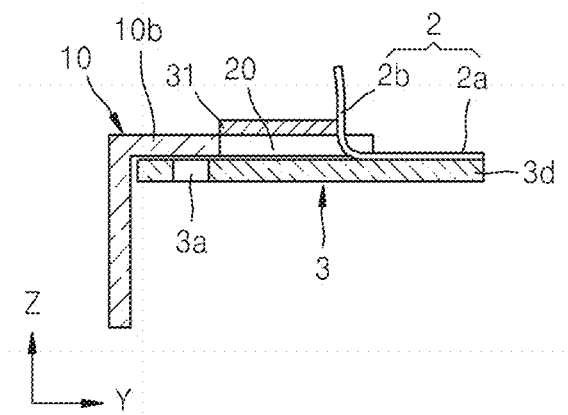
FIG. 6 is a cross-sectional view taken along a line VI-VI of FIG. 5.
Figure 7:
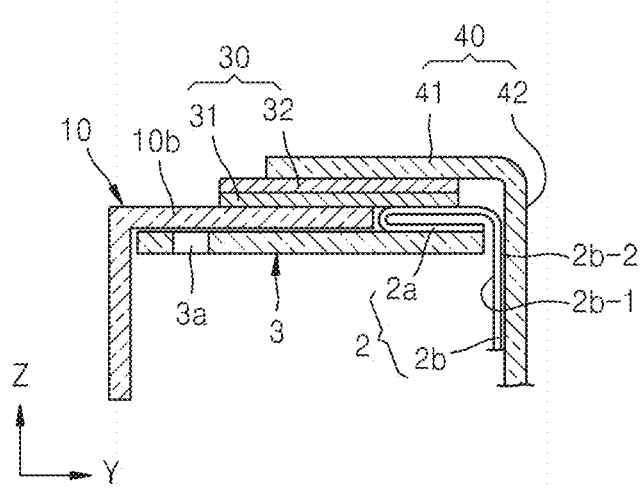
FIG. 7 is a cross-sectional view taken along a line VII-VII of FIG. 5.

FIG. 6 is a cross-sectional view taken along a line VI-VI of FIG. 5, and FIG. 7 is a cross-sectional view taken along a line VII-VII of FIG. 5.

When the carrier tape 3 moves along the X-axis direction by being guided by the tape support unit 10, the part of the cover tape 2 attached to the top surface of the carrier tape 3 is separated by the separation unit 20. Since the separation unit 20 is tilted with respect to the moving direction of the carrier tape 3, the cover tape 2 is separated from the one edge 10b of the tape support unit 10.

In FIG. 6, a region of the cover tape 2 separated from the carrier tape 3 is shown as a separated portion 2b (first side portion) and a region of the cover tape 2 attached to the carrier tape 3 is shown as an attached portion 2a (second side portion).

The separated portion 2b of the cover tape 2 separated from the carrier tape 3 is guided by the bending guide unit 30 to be away from the carrier tape 3 and bend towards the other edge 10a of the tape support unit 10 to turnover with respect to the attached portion 2a of the cover tape 2. The separated portion 2b of the cover tape 2 bent by the bending guide unit 30 is folded at the edge of the carrier tape 3 by the folding guide unit 40. In other words, the cover tape 2 is folded by the folding guide unit 40 such that a surface 2b-1 of the separated portion 2b of the cover tape 2, which faced upward when the cover tape 2 was attached to the carrier tape 3, is dropped down over the attached portion 2a and faces a side 3d of the edge of the carrier tape 3.

The attached portion 2a of the cover tape 2 is continuously attached to the carrier tape 3 while a part of the separated portion 2b of the cover tape 2 is folded, and the other surface 2b-2 of the separated portion 2b of the cover tape 2, which was attached to the carrier tape 3 before being separated from the carrier tape, faces the side plate 42 of the folding guide unit 40. Since the folded cover tape 2 is guided and discharged into the side plate 42 by the side plate 42, the part of the cover tape 2 separated from the carrier tape 3 may be prevented from being deviated outside the tape feeder 100.

Also, some components may move along the cover tape 2 while being adhered to the cover tape 2 that is bent by the bending guide unit 30, due to static electricity, during a predetermined period of time after the cover tape 2 is separated. In this case, since the components adhered to and moving with the cover tape 2 fall down to the folded side of the cover tape 2, the components do not interfere with the movement of the carrier tape 3.

Figure 8:
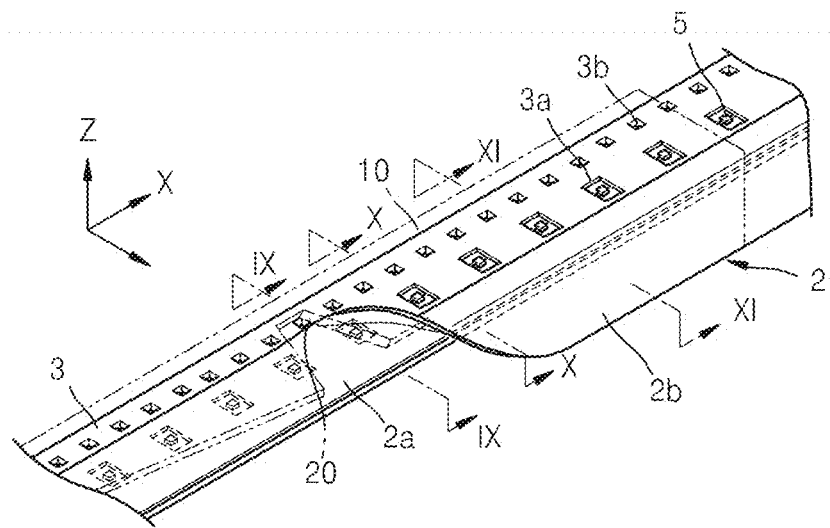
FIG. 8 is a perspective view schematically illustrating an operation relationship of a carrier tape and a cover tape in the tape feeder of FIG. 5.
Figure 9:
FIG. 9 is a cross-sectional view taken along a line IX-IX of FIG. 8.
Figure 10:
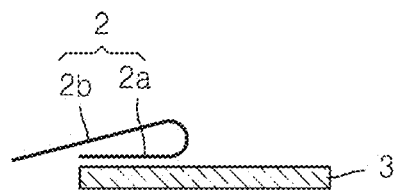
FIG. 10 is a cross-sectional view taken along a line X-X of FIG. 8.
Figure 11:
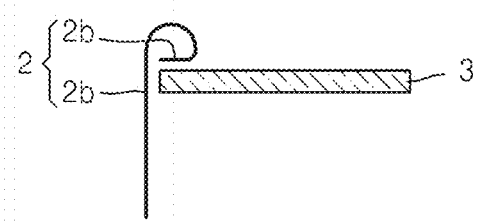
FIG. 11 is a cross-sectional view taken along a line XI-XI of FIG. 8.

FIG. 8 is a perspective view schematically illustrating an operation relationship of the carrier tape 3 and the cover tape 2 in the tape feeder of FIG. 5, FIG. 9 is a cross-sectional view taken along a line IX-IX of FIG. 8, FIG. 10 is a cross-sectional view taken along a line X-X of FIG. 8, and FIG. 11 is a cross-sectional view taken along a line XI-XI of FIG. 8.

For convenience of description, some components shown in previous drawings are not shown in FIGS. 8 through 11.

The part of the cover tape 2 is separated from the carrier tape 3 by the separation unit 20 disposed in the middle of a path for providing the carrier tape 3 in the X-axis direction. As shown in FIG. 9, when the carrier tape 3 reaches the separation unit 20, the part of the cover tape 2 on the surface of the carrier tape 3 is separated.

Referring to FIG. 10, the separated portion 2b of the cover tape 2 separated from the carrier tape 3 is bent to be away from the carrier tape 3. The cover tape 2 may bend by an angle in a range from 225 도 to 315 도 with respect to the carrier tape 3. Referring to FIG. 11, the separated portion 2b of the cover tape 2 is folded to the side of the carrier tape 3. Referring to FIGS. 10 and 11, since the attached portion 2a of the cover tape 2 is continuously attached to the surface of the carrier tape 3 while the separated portion 2b of the cover tape 2 is folded, the carrier tape 3 and the cover tape 2 may be discharged outside the tape feeder 100 together after the electronic components are picked up from the carrier tape 3.

Figure 12A:
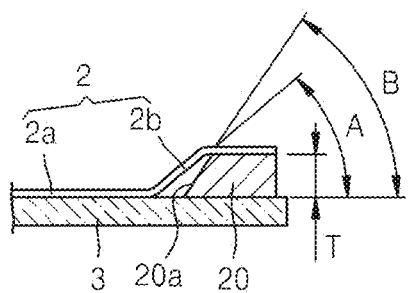
FIG. 12A is a cross-sectional view schematically illustrating an operation state in which the cover tape is separated from the carrier tape by the tape feeder of FIG. 5.
Figure 12B:
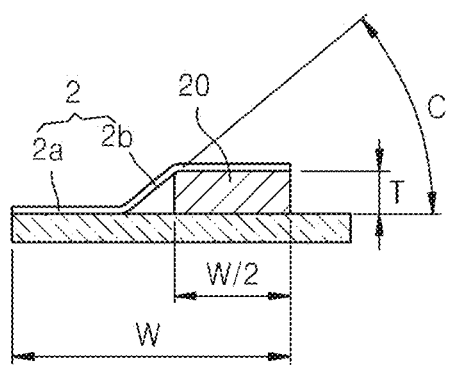
FIG. 12B is a cross-sectional view at a different angle from FIG. 12A.

Widths of the carrier tape 3 and cover tape 2 may increase or decrease according to sizes of the electronic components provided in the carrier tape 3. In the tape feeder 100 described above, since the separated portion 2b of the cover tape 2 is discharged while being folded to the side of the carrier tape, while the attached portion 2a of the cover tape 2 is attached to the carrier tape 3, a width increase of the tape feeder 100 may be reduced even when the widths of the carrier tape 3 and cover tape 2 are wide. In this case, an installation space of the tape feeder 100 may be reduced when the plurality of tape feeders 100 are disposed in parallel in one chip mounter, and thus productivity per unit area of the chip mounter may be improved. FIG. 12A is a cross-sectional view schematically illustrating an operation state in which the cover tape 2 is separated from the carrier tape 3 by the tape feeder 100 of FIG. 5, and FIG. 12B is a cross-sectional view at a different angle from FIG. 12A.

As shown in FIG. 12A, as the carrier tape 3 passes through the separation unit 20, the part of the cover tape 2 becomes the separated portion 2b by being separated from the carrier tape 3, and the remaining part of the cover tape 2 becomes the attached portion 2a that is attached to the carrier tape 3.

The separation unit 20 is tilted with respect to the moving direction of the carrier tape 3, in a thickness direction. In other words, a thickness of the separation unit 20 gradually increases along the moving direction of the carrier tape 3. Accordingly, the separation unit 20 includes a sloping side 20a at a front end facing the carrier tape 3.

In order for the cover tape 2 to be smoothly separated from the carrier tape 3, an angle B of the sloping side 20a at the front end of the separation unit 20 with respect to the surface of the carrier tape 3 may be larger than an angle A of the cover tape 2 with respect to the surface of the carrier tape 3 formed as the cover tape 2 is detached from the carrier tape 3 by the separation unit 20 (B>A).

If the angle A is larger than the angle B (A>B), the cover tape 2 may not be smoothly detached from the carrier tape 3. In FIGS. 12A and 12B, T denotes the thickness of the separation unit 20.

An amount and locations of an adhesive coated between the cover tape 2 and the carrier tape when the cover tape 2 is attached to the carrier tape 3 may be irregular. Accordingly, in order to smoothly separate the cover tape 2 from the carrier tape 3, a width W/2 of the separation unit 20 may be about half a width W of the cover tape 2 as shown in FIG. 12B.

The attached portion 2a of the cover tape 2 should be attached to the edge of the carrier tape 3 while the cover tape 2 is separated from the carrier tape 3. Accordingly, in order for the attached portion 2a not to be detached from the carrier tape 3, the thickness T of the separation unit 20 may be designed such that an angle C of the cover tape 2 detached from the carrier tape 3 by the separation unit 20 may be smaller than an angle for separating the attached portion 2a.

According to the tape feeder described above, since the cover tape 2 is separated by the separation unit 20 disposed on a straight line passing the contact point P1 of the carrier tape 3 and the first sprocket 71, the cover tape 2 may be precisely and stably separated.

Also, since after the part of the cover tape 2 is separated from the carrier tape 3, the carrier tape 3 and the cover tape 2 may move forward and be discharged outside the tape feeder 100 while the separated portion is folded to the side of the carrier tape 3, mechanical components for collecting the cover tape 2 from the tape feeder 100 are not required, and thus the structure of the tape feeder 100 may be simplified.

MODE FOR THE INVENTION

Figure 13:
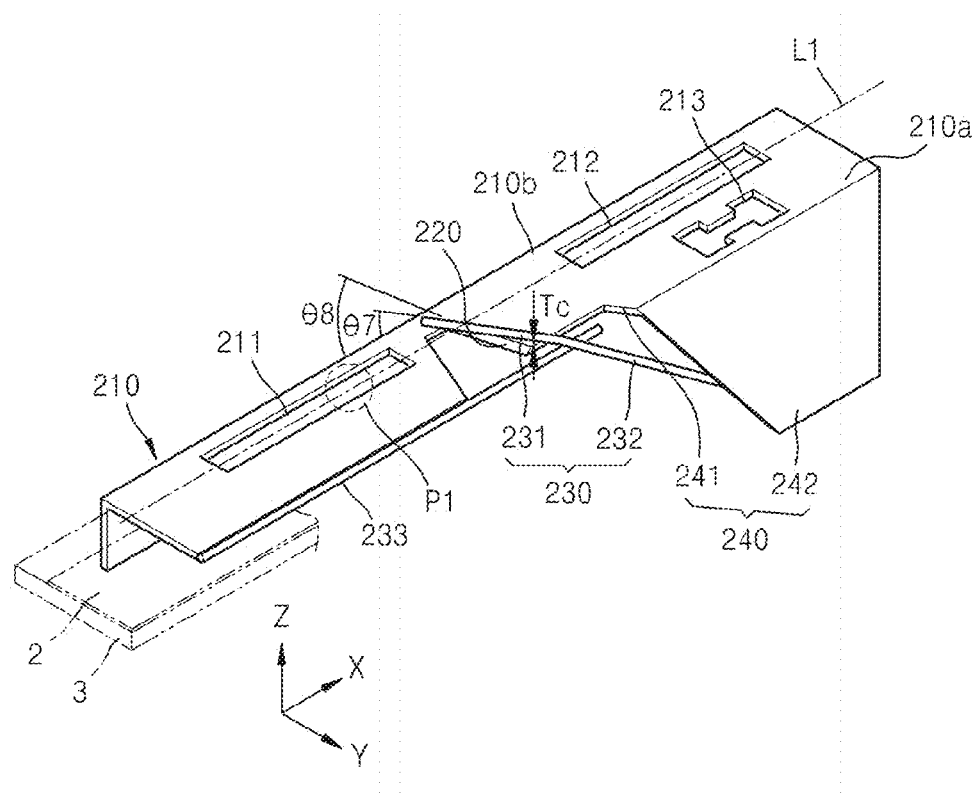
FIG. 13 is a perspective view schematically illustrating a tape feeder for a chip mounter, according to another embodiment of the present invention.

FIG. 13 is a perspective view schematically illustrating a tape feeder for a chip mounter, according to another embodiment of the present invention.

The tape feeder according to the current embodiment of FIG. 13 includes a tape support unit 210 extending along the moving direction of the carrier tape 3 and guiding a movement of the carrier tape 3, a separation unit 220 formed in the tape support unit 210 to separate the part of the cover tape 2, a bending guide unit guiding deformation and movement of the part of the cover tape 2 separated from the carrier tape 3, a folding guide unit 240 guiding folding of the deformed part of the cover tape 2 to the side of the carrier tape 3.

The tape support unit 210 includes long holes 211 and 212 extending along the moving direction (a direction parallel to an X-axis) of the carrier tape 3 so that protruding portions (not shown) of a first sprocket (not shown) and a second sprocket (not shown) pass through the long holes 211 and 212. Also, the tape support unit 210 includes a pick-up hole 213 for externally exposing the region of the carrier tape 3 from which the cover tape 2 is separated.

The separation unit 220 is formed at one edge 210b of the tape support unit 210 while having a tilt angle −8 with respect to the moving direction of the carrier tape 3. The separation unit 220 is disposed to cross the straight line L1 extending along the moving direction of the carrier tape 3 from the contact point P1 of the first sprocket and the carrier tape 3.

The bending guide unit includes a first rod member 230 extending from a top of the separation unit 220 towards a side of the tape support unit 210, and a second rod member 233 extending along a side edge of the tape support unit 210 to cross the first rod member 230.

The folding guide unit 240 includes an introducing unit 241 formed at a region corresponding to the first rod member 230 at another edge 210a of the tape support unit 210 and folding the part of the cover tape 2 bent by the first rod member 230 to the side of the carrier tape 3, and a side plate 242 extending downward from the other edge 210a of the tape support unit 210 to cover the part of the cover tape 2 folded to the side of the carrier tape 3.

The first rod member 230 includes a first extending unit 231 extending while having a tilt angle −7 with respect to the moving direction of the carrier tape 3, and a second extending unit 232 bending downward at an end of the first extending unit 231 and extending towards the side plate 242.

Since the first extending unit 231 of the first rod member 230 is spaced apart from the separation unit 220 upward at a predetermined interval Tc, the part of the cover tape 2 separated from the carrier tape 3 by the separation unit 220 is guided by the first extending unit 231 and bent towards the other edge 210a of the tape support unit 210.

The second extending unit 232 may be connected into the side plate 242. For example, an end of the second extending unit 232 may be welded or fixed via an adhesive into the side plate 242, or fixed into the side plate 242 via a separate fixing unit. As such, since the second extending unit 232 of the first rod member 230 is combined with the side plate 242, the first extending unit 231 may be spaced apart from the top of the separation unit 220 at the predetermine interval Tc while guiding bending of the cover tape 2.

The part of the cover tape 2 bent by the first extending unit 231 may be further bent by the second extending unit 232 at a crossing point of the second rod member 233 and the second extending unit 232 so as to cover the side of the edge of the carrier tape 3.

The part of the cover tape 2 is guided by the second extending unit 232 while being folded to cover the side of the edge of the carrier tape 3 and moves between the side plate 242 and the tape support unit 210.

In order for the first extending unit 231 to guide easy bending of the part of the cover tape 2, the tilt angle −7 of the first extending unit 231 may be smaller than the tilt angle −8 of the separation unit 220 (−8>−7).

Figure 14:
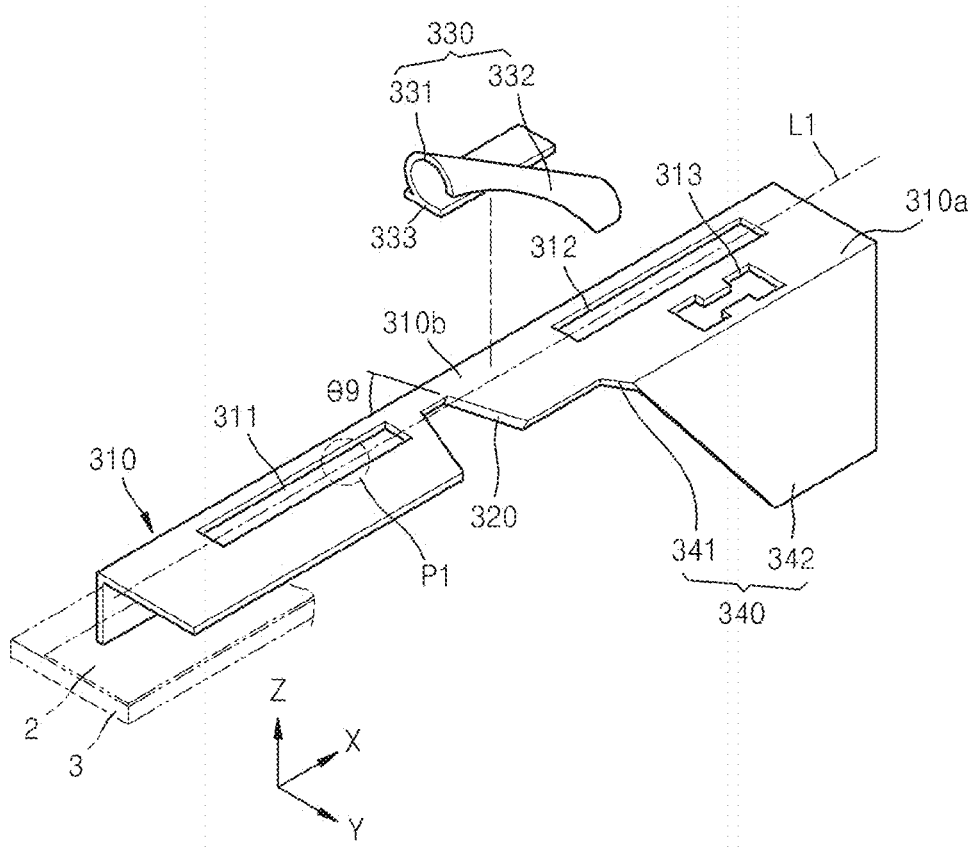
FIG. 14 is a perspective view schematically illustrating a tape feeder for a chip mounter, according to another embodiment of the present invention.
Figure 15:
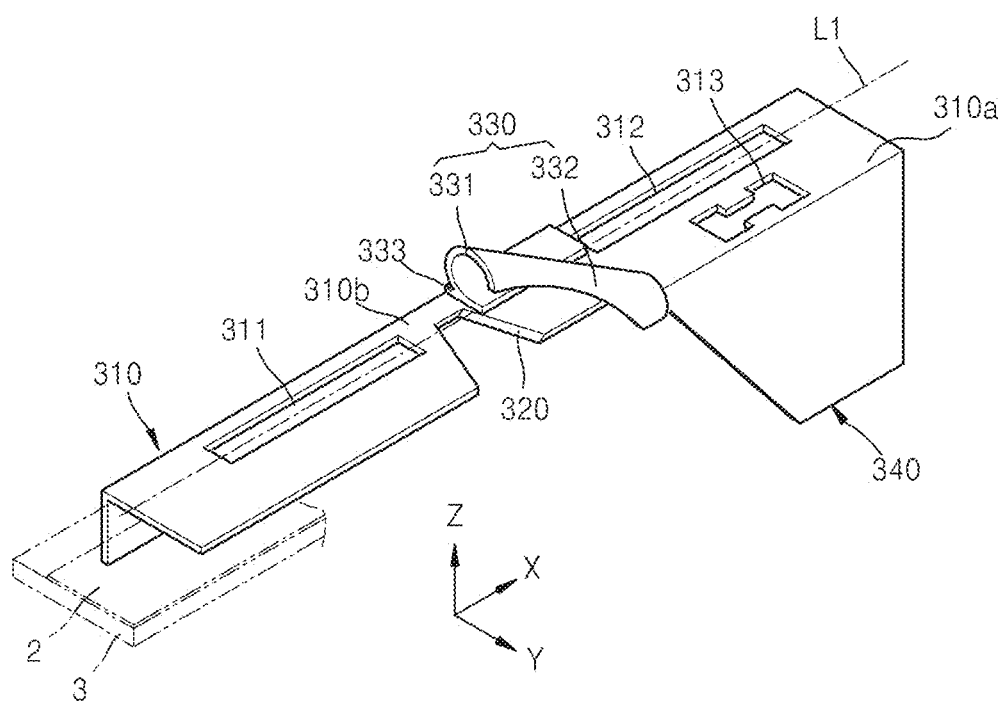
FIG. 15 is a perspective view of the tape feeder of FIG. 14.

FIG. 14 is a perspective view schematically illustrating a tape feeder for a chip mounter, according to another embodiment of the present invention, and FIG. 15 is a perspective view of the tape feeder of FIG. 14.

The tape feeder according to the current embodiment of FIG. 14 includes a tape support unit 310 extending along the moving direction of the carrier tape 3 and guiding the movement of the carrier tape 3, a separation unit 320 formed in the tape support unit 310 to separate a part of the cover tape 2, a bending guide unit 330 guiding deformation and bending of the part of the cover tape 2 separated from the carrier tape 3, and a folding guide unit 340 guiding folding of the deformed part of the cover tape 2 to the side of the carrier tape 3.

The tape support unit 310 includes long holes 311 and 312 extending along the moving direction (direction parallel to the X-axis) of the carrier tape 3 so that protruding portions (not shown) of a first sprocket (not shown) and a second sprocket (not shown) pass through the long holes 311 and 312. Also, the tape support unit 310 includes a pick-up hole 313 for externally exposing the region of the carrier tape 3 from which the cover tape 2 is separated.

The separation unit 320 is disposed to have a tilt angle −9 with respect to the moving direction of the carrier tape 3. The separation unit 320 is disposed to cross the straight line L1 extending along the moving direction of the carrier tape 3 from a contact point P1 of the first sprocket and the carrier tape 3.

The bending guide unit 330 is bent to have a cross section having a semicircle shape opened downward, and extends towards another edge 310a of the tape support unit 310 from the separation unit 320. The bending guide unit 330 includes a base 333 attached to a top surface of the tape support unit 310, a bending unit 331 bending the cover tape 2 that is bent towards a top of the base 333 and is separated by the separation unit 320 disposed at one edge 310b of the tape support unit 310 towards the other edge 310a of the tape support unit 310, and a guiding unit 332 guiding the cover tape 2 bent by the bending unit 331 to the side of the carrier tape 3.

The cover tape 2 that is bent by the bending unit 331 and has passed the guiding unit 332 is folded to the side of the carrier tape 3 by the folding guide unit 340.

The folding guide unit 340 includes an introducing unit 341 folding the part of the cover tape 2 bent by the bending guide unit 330 at the edge of the tape support unit 310 to the side of the carrier tape 3, and a side plate 342 extending downward from the other edge 310a of the tape support unit 310 to cover the part of the cover tape 2 folded to the side of the carrier tape 3.

INDUSTRIAL APPLICABILITY

Embodiments of the present invention may be applied to a tape feeder and a tape feeding method for a chip mounter.

The invention claimed is:

1. A tape feeder for a chip mounter, the tape feeder comprising:
a tape support unit extending along a moving direction of a carrier tape having one surface to which a cover tape is separably attached, and contacting a top surface of the carrier tape;
a separation unit for separating a first side portion of the cover tape in a lengthwise direction from the carrier tape;
a bending guide unit for guiding the first side portion of the cover tape separated from the carrier tape such that the first side portion of the cover tape separated from the carrier tape is bent and away from a separated portion of the carrier tape;
a folding guide unit for folding the first side portion of the cover tape over a second side portion of the cover tape, which is not separated from the carrier tape, to drop the first side portion downward; and
a pair of sprockets disposed below the tape support unit and respectively disposed in front of and at the rear of the separation unit in a transfer direction of the carrier tape so as to bind and move the carrier tape,
wherein the tape support unit and the pair of sprockets are disposed such that the top surface of the carrier tape moves while contacting a bottom surface of the tape support unit
wherein the separation unit is disposed to cross a straight line extending in the moving direction of the carrier tape at a contact point of the pair of sprockets and the carrier tape,
wherein the separation unit is disposed to tilt with respect to the moving direction of the carrier tape, and
wherein a thickness of the separation unit increases along the moving direction of the carrier tape.

2. A tape feeder for a chip mounter, the tape feeder comprising:
a tape support unit extending along a moving direction of a carrier tape having one surface to which a cover tape is separably attached, and contacting a top surface of the carrier tape;
a separation unit for separating a first side portion of the cover tape in a lengthwise direction from the carrier tape;
a bending guide unit for guiding the first side portion of the cover tape separated from the carrier tape such that the first side portion of the cover tape separated from the carrier tape is bent and away from a separated portion of the carrier tape;
a folding guide unit for folding the first side portion of the cover tape over a second side portion of the cover tape, which is not separated from the carrier tape, to drop the first side portion downward; and
a pair of sprockets disposed below the tape support unit and respectively disposed in front of and at the rear of the separation unit in a transfer direction of the carrier tape so as to bind and move the carrier tape,
wherein the tape support unit and the pair of sprockets are disposed such that the top surface of the carrier tape moves while contacting a bottom surface of the tape support unit
wherein the separation unit is disposed to cross a straight line extending in the moving direction of the carrier tape at a contact point of the pair of sprockets and the carrier tape,
wherein the separation unit is disposed to tilt with respect to the moving direction of the carrier tape, and
wherein the bending guide unit comprises at least one plate disposed at a top of the separation unit, and the at least one plate has a sloping side tilting with respect to the moving direction of the carrier tape.

3. The tape feeder of claim 2, wherein a tilt angle of the separation unit with respect to the moving direction of the carrier tape is larger than a tilt angle of the sloping side of the at least one plate with respect to the moving direction of the carrier tape.

4. A tape feeder for a chip mounter, the tape feeder comprising:
a tape support unit extending along a moving direction of a carrier tape having one surface to which a cover tape is separably attached, and contacting a top surface of the carrier tape;

a separation unit for separating a first side portion of the cover tape in a lengthwise direction from the carrier tape;

a bending guide unit for guiding the first side portion of the cover tape separated from the carrier tape such that the first side portion of the cover tape separated from the carrier tape is bent and away from a separated portion of the carrier tape; and a folding guide unit for folding the first side portion of the cover tape over a second side portion of the cover tape, which is not separated from the carrier tape, to drop the first side portion downward, wherein the folding guide unit comprises a top plate disposed on the separation unit and a side plate bending from the top plate and extending downward to cover a side of the carrier tape.

5. A tape feeder for a chip mounter, the tape feeder comprising:

a tape support unit extending along a moving direction of a carrier tape having one surface to which a cover tape is separably attached, and contacting a top surface of the carrier tape;

a separation unit for separating a first side portion of the cover tape in a lengthwise direction from the carrier tape;

a bending guide unit for guiding the first side portion of the cover tape separated from the carrier tape such that the first side portion of the cover tape separated from the carrier tape is bent and away from a separated portion of the carrier tape;

a folding guide unit for folding the first side portion of the cover tape over a second side portion of the cover tape, which is not separated from the carrier tape, to drop the first side portion downward; and a pair of sprockets disposed below the tape support unit and respectively disposed in front of and at the rear of the separation unit in a transfer direction of the carrier tape so as to bind and move the carrier tape, wherein the tape support unit and the pair of sprockets are disposed such that the top surface of the carrier tape moves while contacting a bottom surface of the tape support unit wherein the separation unit is disposed to cross a straight line extending in the moving direction of the carrier tape at a contact point of the pair of sprockets and the carrier tape, wherein the separation unit is disposed to tilt with respect to the moving direction of the carrier tape, and wherein the bending guide unit comprises a first rod member extending from a top of the separation unit towards an edge of the tape support unit and a second rod member extending along an extending direction of the tape support unit to cross the first rod member.

6. The tape feeder of claim 5, wherein the folding guide unit comprises an introducing unit formed at a region corresponding to the first rod member at the edge of the tape support unit to fold the first side portion of the cover tape bent by the first rod member to the edge of the carrier tape, and a side plate extending downward at the edge of the tape support unit to cover the first side portion of the cover tape folded at the edge of the carrier tape.

7. The tape feeder of claim 5, wherein the first rod member comprises a first extending unit extending while tilting with respect to the moving direction of the carrier tape, and a second extending unit bent towards a bottom of the tape support unit to extend towards the side plate at an end of the first extending unit.

8. The tape feeder of claim 7, wherein a tilt angle of the separation unit with respect to the moving direction of the carrier tape is larger than a tilt angle of the first extending unit with respect to the moving direction of the carrier tape.

9. The tape feeder of claim 7, wherein the second extending unit is connected to the inside of the side plate.

10. A tape feeder for a chip mounter, the tape feeder comprising:

a tape support unit extending along a moving direction of a carrier tape having one surface to which a cover tape is separably attached, and contacting a top surface of the carrier tape;

a separation unit for separating a first side portion of the cover tape in a lengthwise direction from the carrier tape;

a bending guide unit for guiding the first side portion of the cover tape separated from the carrier tape such that the first side portion of the cover tape separated from the carrier tape is bent and away from a separated portion of the carrier tape;

a folding guide unit for folding the first side portion of the cover tape over a second side portion of the cover tape, which is not separated from the carrier tape, to drop the first side portion downward; and a pair of sprockets disposed below the tape support unit and respectively disposed in front of and at the rear of the separation unit in a transfer direction of the carrier tape so as to bind and move the carrier tape, wherein the tape support unit and the pair of sprockets are disposed such that the top surface of the carrier tape moves while contacting a bottom surface of the tape support unit wherein the separation unit is disposed to cross a straight line extending in the moving direction of the carrier tape at a contact point of the pair of sprockets and the carrier tape, wherein the separation unit is disposed to tilt with respect to the moving direction of the carrier tape, wherein the bending guide unit bends to have a cross section having a semicircle shape opened downward and extends from the separation unit towards an edge of the tape support unit, and wherein the folding guide unit comprises an introducing unit folding the first side portion of the cover tape bent by the bending guide unit to a side of the carrier tape at the edge of the tape support unit, and a side plate extending downward from the edge of the tape support unit to cover the first side portion of the cover tape folded to the side of the carrier tape.

11. A tape feeder for a chip mounter, the tape feeder comprising:

a tape support unit extending along a moving direction of a carrier tape to which a cover tape is separably attached, and contacting a top surface of the carrier tape;

a separation unit for separating a first side portion of the cover tape in a lengthwise direction from the carrier tape;

a folding guide unit for folding the first side portion of the cover tape at a second side portion of the cover tape, which is not separated; and a pair of sprockets respectively disposed in front of and at the rear of the separation unit, wherein the separation unit is disposed to cross a straight line passing a contact point of the pair of sprockets and the carrier tape and extending in the moving direction of the carrier tape, wherein a thickness of the separation unit increases along the moving direction of the carrier tape.

12. A tape feeder for a chip mounter, the tape feeder comprising:
- a tape support unit extending along a moving direction of a carrier tape to which a cover tape is separably attached, and contacting a top surface of the carrier tape;
- a separation unit for separating a first side portion of the cover tape in a lengthwise direction from the carrier tape;
- a folding guide unit for folding the first side portion of the cover tape at a second side portion of the cover tape, which is not separated; and
- a pair of sprockets respectively disposed in front of and at the rear of the separation unit,
- wherein the separation unit is disposed to cross a straight line passing a contact point of the pair of sprockets and the carrier tape and extending in the moving direction of the carrier tape,
- wherein the folding guide unit comprises a top plate disposed on the separation unit and a side plate bent from the top plate and extending downward to cover a side of the carrier tape.

13. A method of providing components for a chip mounter, the method comprising:
- providing a carrier tape to which a cover tape is separably attached and which accommodates electronic components thereon to a pick-up location of the chip mounter while contacting a top surface of the carrier tape to a bottom surface of a tape support unit;
- separating a first side portion of the cover tape in a lengthwise direction from the carrier tape;
- bending the first side portion of the cover tape such that the first side portion crosses over a second side portion of the cover tape and drops downward outside the second side portion of the cover tape; and
- discharging the carrier tape from which at least the first side portion is separated,
- wherein the bending comprises:
  - first bending the first side portion of the cover tape to be away from the carrier tape;
  - second bending the first side portion of the cover tape, that is away from the carrier tape, to turnover with respect to the carrier tape; and
  - third bending the second bent first side portion of the cover tape to cross over the second side portion of the cover tape and drop downward with respect to the second side portion of the cover tape, and
- wherein the first bending, the second bending, and the third bending are performed by individual units that are not integrally formed with each other.

* * * * *